(12) United States Patent
Kojima et al.

(10) Patent No.: US 6,312,530 B1
(45) Date of Patent: Nov. 6, 2001

(54) MAGNETOSTRICTIVE MATERIAL

(75) Inventors: Akinori Kojima; Akihiro Makino; Takashi Hatanai; Yutaka Yamamoto, all of Niigata-ken; Akihisa Inoue, 11-806 Kawauchijutaku, 35 Motohasekura, Kawauchi, Aoba-ku, Sendai-shi, Miyagi-ken, all of (JP)

(73) Assignees: Alps Electric Co., Ltd., Tokyo; Akihisa Inoue, Miyagi-ken, both of (JP)

( * ) Notice: Subject to any disclaimer, the term of this patent is extended or adjusted under 35 U.S.C. 154(b) by 0 days.

(21) Appl. No.: 09/173,292

(22) Filed: Oct. 14, 1998

(30) Foreign Application Priority Data

Oct. 23, 1997 (JP) .................................................. 9-291409
Sep. 28, 1998 (JP) ................................................ 10-273999

(51) Int. Cl.$^7$ ..................................................... H01F 1/055
(52) U.S. Cl. ............................................ 148/301; 75/246
(58) Field of Search ............................. 148/301; 75/245, 75/246

(56) References Cited

U.S. PATENT DOCUMENTS

| | | | | |
|---|---|---|---|---|
| 4,152,178 | * | 5/1979 | Malekzadeh et al. | 148/103 |
| 5,110,376 | * | 5/1992 | Kobayashi et al. | 148/301 |
| 5,336,337 | * | 8/1994 | Funayama et al. | 148/301 |

FOREIGN PATENT DOCUMENTS

| 8027545A | 1/1996 | (JP) . |
|---|---|---|
| 8-27545 | * 1/1996 | (JP) . |

* cited by examiner

Primary Examiner—John Sheehan
(74) Attorney, Agent, or Firm—Brinks Hofer Gilson & Lione

(57) ABSTRACT

A magnetostrictive material is produced by annealing an alloy consisting essentially of an amorphous phase and comprising Fe, Dy, and Tb as primary components, at least one element selected from the group consisting of Ta, Nb, Zr, Hf, V, W, Mo, Si and B and/or at least one element selected from the group consisting of Cr, Al, Ga, Ge, Cu, Au, Ag, Pt, Pd, Os, Ir, and Rh.

14 Claims, 15 Drawing Sheets

MAGNETOSTRICTIVE MATERIAL

BACKGROUND OF THE INVENTION

1. Field of the Invention

The present invention relates to magnetostrictive materials used for ultrasonic vibration elements, actuators and sensors. The present invention particularly relates to a magnetostrictive material primarily containing iron, a rare earth element, and a transition metal.

2. Description of the Related Art

Alloys $RT_2$ composed of a specified rare earth element R and a specified transition metal T are known as magnetostrictive materials having a large magnetostrictive constant. Among them, the alloy having a composition $Tb_{0.26}Dy_{0.74}Fe_2$ has a large magnetic susceptibility and a large electromechanical coupling coefficient due to low magnetocrystalline anisotropy, and is known as a supermagnetostrictive material having excellent magnetostrictive characteristics. Recently, Tb-Fe-based magnetostrictive materials have also been studied. The materials are produced by annealing quenched amorphous ribbons to form precipitates of fine crystalline phases in order to reduce magnetocrystalline anisotropy.

A magnetostrictive material composed of the $Tb_{0.26}Dy_{0.74}Fe_2$ alloy is produced through many production steps as follows. The alloy is melted by high frequency melting or arc melting, the melt is cooled into a given shape, and the product is annealed for a prolonged period to remove process strain. Thus, the process cost is inevitably high.

An effective method for raising the electromechanical coupling coefficient of such a magnetostrictive material is to orient the axis for easy magnetization (hereinafter referred to as the "easy axis") of crystal grains in the texture. Such a means, however, requires high-skill technologies with high production costs. Further, the magnetostrictive material is disadvantageous with respect to workability or processability because of its high mechanical strength and low toughness.

Since the Tb-Fe-based magnetostrictive material including fine crystalline textures is produced as a ribbon, materials having shapes other than a ribbon are obtainable with difficulty.

SUMMARY OF THE INVENTION

It is an object of the present invention to provide a magnetostrictive material which has high workability and excellent magnetostrictive characteristics, and which can be formed into desired shapes at low production costs.

A magnetostrictive material in accordance with the present invention is produced by annealing an alloy consisting essentially of an amorphous phase and comprising Fe, Dy, and Tb as primary components, at least one element selected from the group consisting of Ta, Nb, Zr, Hf, V, W, Mo, Si and B and/or at least one element selected from the group consisting of Cr, Al, Ga, Ge, Cu, Au, Ag, Pt, Pd, Os, Ir, and Rh.

The magnetostrictive material may be a compact formed by compacting and sintering the powder of the alloy consisting essentially of the amorphous phase so as to precipitate fine crystalline phases having an average crystal grain size of 100 nm or less.

The compact may be formed by compacting and sintering the powder of the alloy consisting essentially of the amorphous phase by means of a softening phenomenon when the alloy is crystallized.

The compact may be formed by compacting and sintering the powder under a stress of the alloy consisting essentially of the amorphous phase when the alloy is crystallized.

Preferably, the magnetostrictive material has magnetic anisotropy in the direction of the pressure which is applied to the magnetostrictive material.

Preferably, the compact has a relative density of 90% or more.

Preferably, the compact is formed by sintering and simultaneously annealing the powder of the alloy consisting essentially of the amorphous phase so as to precipitate fine crystalline phases having an average crystal grain size of 100 nm or less.

Preferably, the temperature of the annealing is in a range of 400° C. to 800° C.

Preferably, the alloy is represented by the formula:

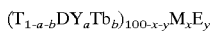
$$(T_{1-a-b}DY_aTb_b)_{100-x-y}M_xE_y$$

wherein T denotes at least one element selected from the group consisting of Fe, Co and Ni; M denotes at least one element selected from the group consisting of Ta, Nb, Zr, Hf, V, W, Mo, Si and B; E denotes at least one element selected from the group consisting of Cr, Al, Ga, Ge, Cu, Au, Ag, Pt, Pd, Os, Ir, and Rh; $0 \leq a \leq 0.5$; $0 \leq b \leq 0.5$; $0.1 \leq a+b \leq 0.5$; 0 atomic percent $\leq x \leq 10$ atomic percent; 0 atomic percent $\leq y \leq 10$ atomic percent; and 2 atomic percent $\leq x+y \leq 20$ atomic percent.

DESCRIPTION OF THE PREFERRED EMBODIMENTS

Figure 1:
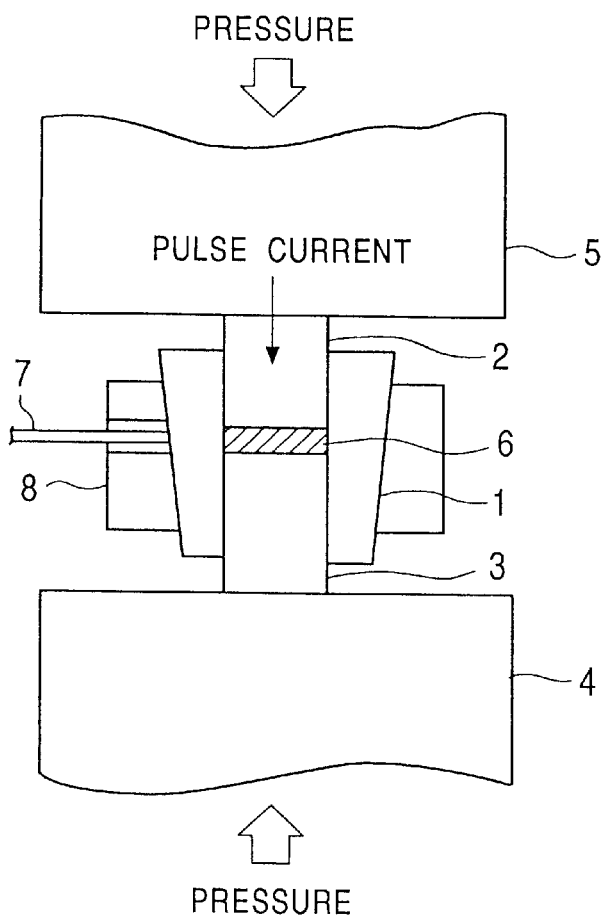
FIG. 1 is a cross-sectional view of the main section of a spark plasma sintering apparatus used in the production of a compact of a magnetostrictive material in accordance with the present invention.

The preferred embodiments of the present invention will now be described with reference to the attached drawings.

The magnetostrictive material in accordance with the present invention is Composed Of an alloy which contains Fe, Dy, and Tb as primary components, at least one element selected from the group consisting of Ta, Nb, Zr, Hf, V, W, Mo, Si, and B, and/or at least one element selected from the group consisting of Cr, Al, Ga, Ge, Cu, Au, Ag, Pt, Pd, Os, Ir, and Rh. The magnetostrictive material is produced by annealing the alloy which essentially consists of an amorphous phase so that fine crystalline phases having an average crystal grain size of 100 nm or less are precipitated in the alloy. A part of, and preferably 50% or less of Fe, may be replaced with Co or Ni.

The magnetostrictive material In accordance with the present invention is a compact which is formed by compacting and sintering the powder of the amorphous alloy under a stress by means of a softening phenomenon occurring during crystallization of the alloy. Thus, the compact shows magnetic anisotropy in the direction of the pressure applied to the alloy.

Amorphous alloy powder for molding is prepared in the production of the compact of the magnetostrictive material. The amorphous alloy powder is prepared by quenching the melt of an alloy or by pulverizing a ribbon which is produced by quenching the melt of the alloy. In detail, the alloy melt is sprayed onto a rotating drum to quench the melt and the resulting amorphous alloy ribbon is pulverized. Alternatively, the alloy melt is sprayed into a cooling gas to quench the melt as droplets and to form powder. A sputtering process or a CVD process is also useful for production of the amorphous alloy. The quenched alloy ribbon and powder is primarily composed of an amorphous phase texture. The amorphous alloy powder has a grain size of approximately 50 to 150 μm.

The alloy powder is annealed under stress so as to crystallize the amorphous phase in the alloy powder, and it is simultaneously or subsequently compacted. Fine crystalline phases having an average crystal grain size of 100 nm or less are thereby precipitated in the amorphous phase texture, and the easy axes of the crystal grains in the fine crystalline phases are oriented in the direction of the pressure which is applied to the alloy powder. As a result, the resulting compact has magnetic anisotropy.

The compact having magnetic anisotropy has high magnetic susceptibility and thus a high electromechanical coupling coefficient for an external magnetic field in a specified direction. Thus, the magnetostrictive material in accordance with the present invention has excellent magnetostrictive characteristics.

It is preferred that the alloy powder be heated when it is subjected to crystallization or crystal grain growth. In the compaction of the alloy powder, sintering is preferably performed by means of a softening phenomenon which occurs during crystallization of the amorphous alloy, based on the following grounds. When an amorphous alloy is heated, a softening phenomenon is noticeable prior to reaching the crystallization temperature. The softened particles of the amorphous alloy powder are compacted and sintered under pressure. Thus, a high-density compact of the magnetostrictive material is prepared.

Since the compaction by the softening phenomenon during the crystallization of the amorphous alloy is performed at a relatively low temperature, the resulting compact has a fine texture.

The following is an example of production of a compact using an alloy powder. Pressure is applied to an amorphous alloy powder in a spark plasma sintering apparatus, while a pulse current is applied to the alloy powder to heat the alloy powder for a given time. A compact containing a fine crystalline texture is formed by compaction of the amorphous alloy powder. Alternatively, a pulse current is applied to the amorphous alloy powder to heat the powder near the crystallization temperature, and then pressure is applied to the powder by a pair of punches to form a compact.

FIG. 1 is a cross-sectional view of the main section of a spark plasma sintering apparatus which is preferably used in the production of the compact of the magnetostrictive material in accordance with the present invention. The spark plasma sintering apparatus includes a die 1 composed of tungsten carbide, an upper punch 2 and a lower punch 3 which are composed of tungsten carbide and inserted in the die 1, and an outer die 8 composed of tungsten carbide and provided at the exterior of the die 1, and a table 4 which supports the lower punch 3 and functions as an electrode for a pulse current, and a thermocouple 7 measuring the temperature of the alloy powder 6 placed between the upper and lower punches 2 and 3.

Figure 2:
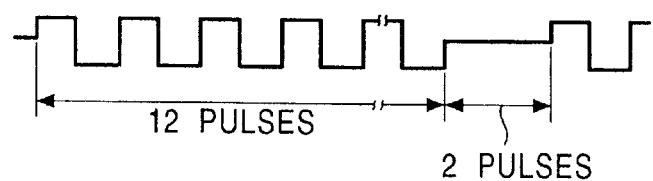
FIG. 2 is a diagram of the shape of a pulse sequence which is applied to an alloy powder in the spark plasma sintering apparatus in FIG. 1.

In the production of a compact, the alloy powder 6 is placed between the upper and lower punches 2 and 3. The interior of the chamber is evacuated, while a pressure is applied to the alloy powder 6 by the punches 2 and 3 and a pulse current sequence as shown, for example, in FIG. 2 is simultaneously applied to the alloy powder 6. The amorphous alloy powder 6 is thereby heated under stress for a predetermined time near the crystallization temperature of the alloy.

The pressure applied to the alloy powder is in a range of 200 to 1,500 MPa, and preferably 500 to 1,000 MPa. At a pressure of less than 200 MPa, the resulting fine crystalline phase does not have sufficient magnetic anisotropy after the subsequent annealing treatment, and the compact has a high porosity and thus a low relative density. A pressure of higher than 1,500 MPa will cause rupture of the tungsten carbide die because of the fatigue limit at such a high temperature. The heating rate of the alloy powder 6 is 10° C./min. or more and more preferably 20° C./min. or more. A heating rate less than the lower limit causes coarsening of the crystal grains, and thus an excessive increase in magnetocrystalline anisotropy, resulting in deterioration of soft magnetism.

In the spark plasma sintering process, when the sintering temperature is Ts and the initial temperature of the crystallization of the amorphous alloy is Tx, it is preferred that the sintering be performed at a temperature in a range satisfying the relationship Tx−200° C.≦Ts° C.≦Tx+200° C. At a sintering temperature of less than Tx−200° C., a high-density compact is not obtainable. At a sintering temperature of higher than Tx+200° C., the fine crystalline phases are coarsened, resulting in deterioration of magnetostrictive characteristics.

In the sintering using the spark plasma sintering apparatus, the alloy powder is rapidly heated at a desired heating rate by means of the current passing through the powder, and the temperature of the alloy powder is strictly controlled by the current. The temperature control in this process is significantly precise compared with heating using a heater. Thus, the sintering process can be precisely designed.

Instead of the above-mentioned process for preparing the compact, the alloy powder may be placed into a mold and be compacted using a hot press and simultaneously heated to a temperature near the crystallization temperature of the amorphous alloy. Thus, the amorphous alloy powder is sintered during or after the crystallization to form a compact.

In the sintering of the alloy powder by means of a softening phenomenon, it is preferred that the pressure, the temperature and the sintering time be controlled so that the relative density of the compact is 90% or more. The resulting compact has a dense texture contributing to excellent mechanical properties and is useful as a magnetostrictive material having excellent magnetostrictive characteristics.

After the crystallization or crystal grain growth of the alloy powder under pressure, the alloy is annealed after or during the sintering at a temperature of 400° C. to 800° C. to precipitate fine crystalline phases having an average crystal grain size of 100 nm as the primary phase in the texture of the compact. Such fining of the crystal grains moderates magnetocrystalline anisotropy of the compact. Thus, the compact has excellent soft magnetism suitable for the magnetostrictive material in accordance with the present invention.

Such a soft magnetism will not appear at an annealing temperature of less than 400° C., since required amounts of fine crystalline phases are not precipitated. The soft magnetism will also deteriorate at an annealing temperature of higher than 800° C., since coarsening of the fine crystalline phases causes an increase in magnetocrystalline anisotropy. The magnetocrystalline anisotropy of the magnetostrictive compact can be moderated as follows. The conditions are selected such that the fine crystalline phases having an average crystal grain size of 100 nm or more occupies 70 percent by volume of the compact, the balance being an amorphous phase, and that $TbFe_2$ phases having a positive magnetocrystalline anisotropic constant and $DyFe_2$ phases having a negative magnetocrystalline anisotropic constant are formed in the fine crystalline phases. These phases mutually cancel magnetocrystalline anisotropy.

It is preferable that the annealing time (holding time) be in a range of 0 to 180 minutes (wherein the annealing time of 0 minutes means that the alloy is cooled without holding immediately after it is heated to the maximum temperature), and more preferably 3 to 60 minutes. Fine crystalline grains will grow during annealing for a time longer than 180 minutes. Thus, magnetocrystalline anisotropy undesirably increases to reduce soft magnetism.

The amorphous alloy used for production of a magnetostrictive compact of the present invention will be described in more detail.

According to the studies of amorphous alloys by the present inventors, alloys having excellent magnetostrictive characteristics have the composition represented by the following formula:

$$(T_{1-a-b}Dy_aTb_b)_{100-x-y}M_xE_y$$

wherein T denotes at least one element selected from the group consisting of Fe, Co and Ni; M denotes at least one element selected from the group consisting of Ta, Nb, Zr, Hf, V, W, Mo, Si and B; E denotes at least one element selected from the group consisting of Cr, Al, Ga, Ge, Cu, Au, Ag, Pt, Pd, Os, Ir, and Rh; $0 \leq a \leq 0.5$; $0 \leq b \leq 0.5$; $0.1 \leq a+b \leq 0.5$; 0 atomic percent $\leq x \leq 10$ atomic percent; 0 atomic percent $\leq y \leq 10$ atomic percent; and 2 atomic percent $\leq x+y \leq 20$ atomic percent.

Fe, Dy and Tb are main components of the alloy which essentially consists of an amorphous phase. These components have magnetostrictive characteristics and soft magnetism. A part, preferably 50% or less, of Fe may be replaced with Co or Ni. These elements are present as a $TbFe_2$ phase and a $DyFe_2$ phase which are formed by annealing and have magnetostrictive characteristics.

In the formula, the subscript a representing the Dy content is preferably in a range of 0 to 0.5, and more preferably 0.2 to 0.4. When the subscript a is higher than 0.5, magnetization undesirably decreases due to a decreased Fe content. The subscript b representing the Tb content is preferably in a range of 0 to 0.5, and more preferably 0.2 to 0.4. When the subscript b is higher than 0.5, magnetization undesirably decreases due to a decreased Fe content. The total content of Dy and Tb, (a+b), to Fe is preferably in a range of 0.1 to 0.5, and more preferably 0.2 to 0.4. A total content (a+b) of less than 0.1 causes an undesirable decrease in magnetostrictive characteristics, and a total content of higher than 0.5 causes a decrease in magnetization due to a reduction in the Fe content.

In the formula, M denotes at least one element selected from the group consisting of Ta, Nb, Zr, Hf, V, W, Mo, Si, and B. These elements aid the formation of an amorphous phase having excellent soft magnetism. The subscript x representing the atomic ratio of the element M is 0 to 10 atomic percent in the present invention, in order to precipitate sufficiently large amounts of fine crystalline phases in the amorphous phase in the alloy. More excellent soft magnetism is achieved for a subscript x of 2 to 8 atomic percent.

In the formula, E denotes at least one element selected from the group consisting of Cr, Al, Ga, Ge, Cu, Au, Ag, Pt, Pd, Os, Ir and Rh. These components contribute to fining of the texture during the annealing and improvement in corrosion resistance. The subscript y representing the atomic ratio of the element E is 0 to 10 atomic percent in the present invention in order to precipitate sufficiently large amounts of fine crystalline phases in the amorphous phase in the alloy so that the alloy has excellent soft magnetism. More excellent soft magnetism is achieved for a subscript y of 0.5 to 5 atomic percent.

In the formula, the alloy may contain at least one of the elements M and E, but the total content (x+y) of the elements M and E must be in a range of 2 to 20 atomic percent. More excellent soft magnetism is achieved for a total content (x+y) of 3 to 10 atomic percent. A total content (x+y) of the elements M and E of less than 2 atomic percent results in difficulty in the formation of amorphous phases, whereas a total content (x+y) of more than 20 atomic percent causes undesirable deterioration of soft magnetism due to a decrease in the Fe content.

The magnetostrictive material is composed of an alloy containing Fe, Dy, and Tb as primary components, at least one element selected from the group consisting of Ta, Nb, Zr, Hf, V, W, Mo, Si and B and/or at least one element selected from the group consisting of Cr, Al, Ga, Ge, Cu, Au, Ag, Pt, Pd, Os, Ir, and Rh. The alloy contains fine crystalline phases having an average grain size of 100 nm or less in the texture which are precipitated in an amorphous phase during annealing. Thus, the magnetostrictive material has a high magnetic susceptibility because of reduced magnetocrystalline anisotropy, and a high electromechanical coupling coefficient which is effective for excellent magnetostrictive characteristics.

The magnetostrictive material is a compact which is formed by compacting and sintering an amorphous alloy under a stress by means of a softening phenomenon when the alloy is crystallized. A compact having a required shape can be formed. The magnetostrictive material has magnetic anisotropy in the direction of the pressure which is applied during the compaction. A high magnetic susceptibility in a given direction causes a large electromechanical coupling coefficient and thus improves magnetostrictive characteristics in the given direction.

Since the magnetostrictive material is formed as a compact by compacting and sintering amorphous alloy powder by means of a softening phenomenon during crystallization of the alloy, the compact has a high density of generally 90% or more. Thus, the compact has excellent mechanical properties, as well as excellent magnetostrictive characteristics. In the production of the compact from the alloy powder, the spark plasma sintering process rapidly heats the alloy powder at a given heating rate and strictly controls the temperature of the alloy powder. Thus, the process enables ideal sintering.

After the crystallization or crystal grain growth of the alloy powder under pressure, the alloy is annealed after or during the sintering at a temperature of 400° C. to 800° C. to precipitate fine crystalline phases having an average crystal grain size of 100 nm as the primary phase in the compact. Such fining of the crystal grains moderates magnetocrystalline anisotropy of the compact. Thus, the compact has excellent soft magnetism suitable for the magnetostrictive material in accordance with the present invention.

The magnetostrictive material is formed by annealing an amorphous alloy represented by the following formula:

$$(T_{1-a-b}Dy_aTb_b)_{100-x-y}M_xE_y$$

wherein T denotes at least one element selected from the group consisting of Fe, Co and Ni; M denotes at least one element selected from the group consisting of Ta, Nb, Zr, Hf, V, W, Mo, Si and B; E denotes at least one element selected from the group consisting of Cr, Al, Ga, Ge, Cu. Au, Ag, Pt, Pd, Os, Ir, and Rh; $0 \leq a \leq 0.5$; $0 \leq b \leq 0.5$; $0.1 \leq a+b \leq 0.5$; 0 atomic percent $\leq x \leq 10$ atomic percent; 0 atomic percent $\leq y \leq 10$ atomic percent; and 2 atomic percent $\leq x+y \leq 20$ atomic percent. The magnetostrictive material has excellent magnetostrictive characteristics and soft magnetism. When boron (B) is used as the element M, the magnetostrictive material has a high magnetostriction constant and superior magnetostrictive characteristics at a low magnetic field because of a decrease in coercive force of the magnetostrictive material.

EXAMPLES

Example 1

Predetermined amounts of Fe, Dy, Tb, Nb, Zr, Si, B, and Cu were melted in a high-frequency induction heating unit in a reduced-pressure Ar atmosphere to prepare an ingot having a given composition. The ingot was melted in a crucible, and the melt was sprayed onto a rotating roll through a nozzle in a reduced-pressure Ar atmosphere to form a quenched ribbon having an amorphous texture (single roll process). The quenched ribbon was heated to 500° C. to 750° C. in an infrared furnace at $1 \times 10^{-2}$ Pa or less and was held at that temperature for approximately 3 minutes to form fine crystalline phases in the alloy.

A series of alloy ribbons having the following formulae were formed in such a manner: $(Fe_2Dy_{0.7}Tb_{0.3})_{94}Nb_6$, $(Fe_2Dy_{0.7}Tb_{0.3})_{94}Zr_6$, $(Fe_2Dy_{0.7}Tb_{0.3})_{96}Si_4$, $(Fe_2Dy_{0.7}Tb_{0.3})_{93}Nb_2B_5$, $(Fe_2Dy_{0.7}Tb_{0.3})_{93}Nb_2Si_5$, $(Fe_2Dy_{0.7}Tb_{0.3})_{92}Nb_8$, $(Fe_2Dy_{0.7}Tb_{0.3})_{91}Si_3B_6$, $(Fe_2Dy_{0.7}Tb_{0.3})_{91}Nb_3B_5Cu_1$, $(Fe_2Dy_{0.7}Tb_{0.3})_{92}Zr_2B_5Cu_1$, $(Fe_2Dy_{0.7}Tb_{0.3})_{90}Nb_2Si_5B_3$, $(Fe_2Dy_{0.6}Tb_{0.4})_{94}Nb_6$, $(Fe_2Dy_{0.5}Tb_{0.5})_{94}Zr_6$, $(Fe_2Dy_{0.1}Tb_{0.9})_{94}Si_6$, $(Fe_2Dy_{0.6}Tb_{0.4})_{93}Nb_2B_5$, and $(Fe_2Dy_{0.6}Tb_{0.4})_{93}Nb_2Si_5$.

The magnetostriction constants of these fine crystalline ribbons were determined under an applied magnetic field of 5 kOe at room temperature by a three-terminal capacitance method. The results are shown in Table 1.

Table 1 shows that alloys having the compositions in accordance with the present invention have excellent magnetostrictive characteristics, that is, high magnetostriction constants.

TABLE 1

| Composition of alloy | Annealing temperature (° C.) | magnetostriction constant ($\times 10^{-6}$) |
| --- | --- | --- |
| $(Fe_2Dy_{0.7}Tb_{0.3})_{94}Nb_6$ | 550 | 800 |
| $(Fe_2Dy_{0.7}Tb_{0.3})_{94}Zr_6$ | 550 | 600 |
| $(Fe_2Dy_{0.7}Tb_{0.3})_{93}Nb_2B_5$ | 600 | 900 |
| $(Fe_2Dy_{0.7}Tb_{0.3})_{93}Nb_2Si_5$ | 600 | 850 |
| $(Fe_2Dy_{0.7}Tb_{0.3})_{92}Nb_8$ | 600 | 700 |
| $(Fe_2Dy_{0.7}Tb_{0.3})_{91}Si_3B_6$ | 600 | 500 |
| $(Fe_2Dy_{0.7}Tb_{0.3})_{91}Nb_3B_5Cu_1$ | 500 | 900 |
| $(Fe_2Dy_{0.7}Tb_{0.3})_{92}Zr_3B_5Cu_1$ | 500 | 950 |
| $(Fe_2Dy_{0.7}Tb_{0.3})_{90}Nb_3Si_5B_3$ | 750 | 1,200 |
| $(Fe_2Dy_{0.6}Tb_{0.4})_{94}Nb_6$ | 550 | 1,000 |
| $(Fe_2Dy_{0.5}Tb_{0.5})_{94}Zr_6$ | 550 | 1,100 |
| $(Fe_2Dy_{0.6}Tb_{0.4})_{93}Nb_2B_5$ | 600 | 950 |
| $(Fe_2Dy_{0.6}Tb_{0.4})_{93}Nb_2Si_5$ | 650 | 1,250 |

Example 2

Figure 3A:
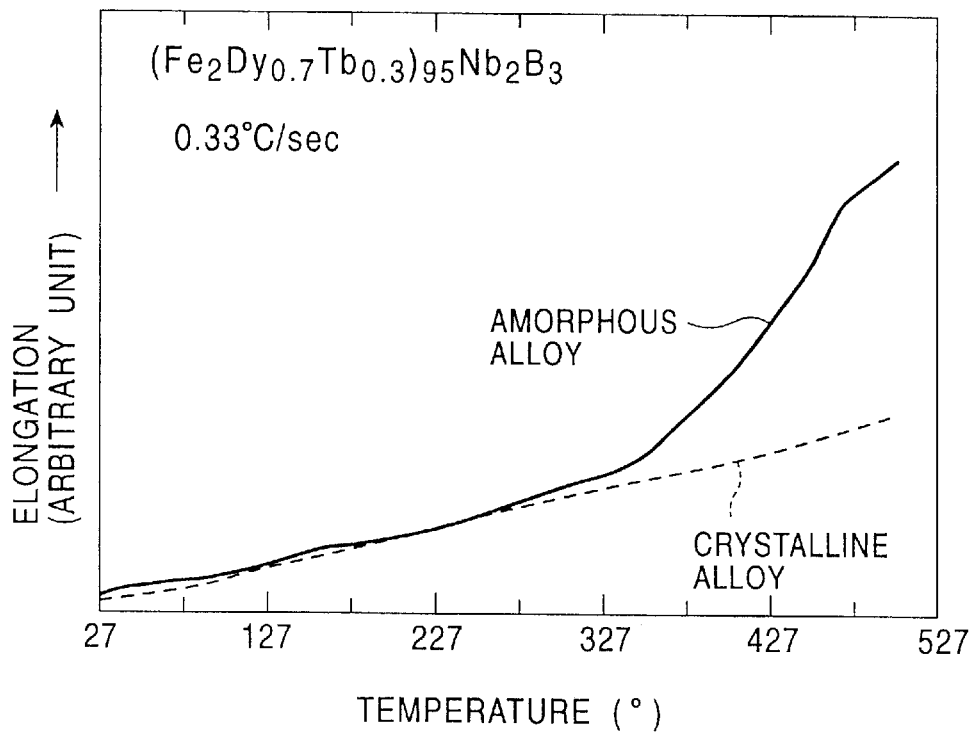
FIG. 3A is a TMA thermogram and FIG. 3B is a DSC thermogram of a quenched ribbon of a magnetostrictive material in accordance with the present invention and a crystalline alloy not containing an amorphous phase.
Figure 3B:
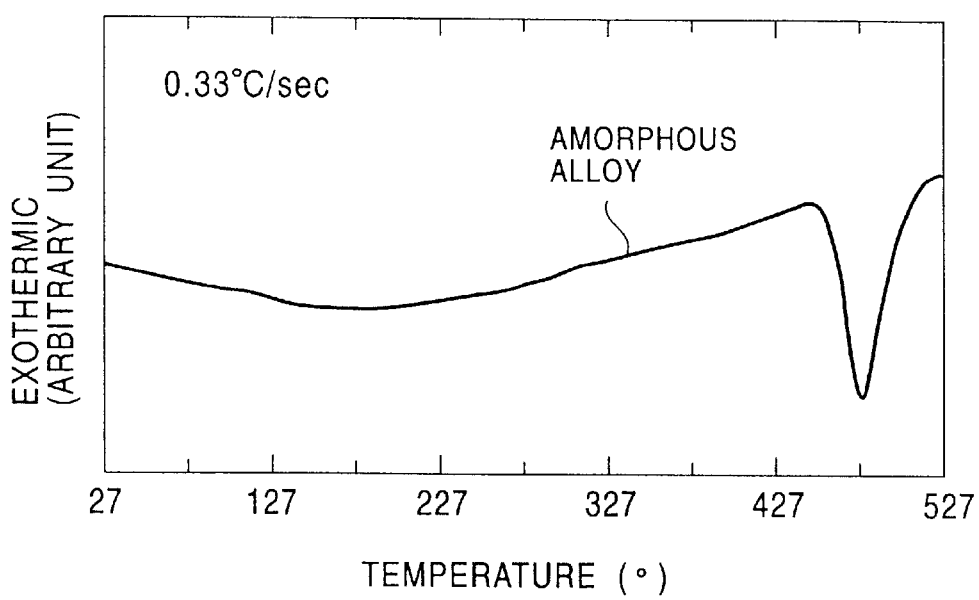

A quenched ribbon having a composition $(Fe_2Dy_{0.7}Tb_{0.3})_{95}Nb_2B_3$ was prepared as in EXAMPLE 1. The quenched ribbon was subjected to differential scanning calorimetry (DSC) and thermal mechanical analysis (TMA) at a heating rate of 0.33 K/s. The DSC thermogram in FIG. 3B shows an exothermic peak near 477° C. (750 K) indicating crystallization of TbFe$_2$ and DyFe$_2$ phases, whereas the TMA curve in FIG. 3A shows an elongation of the test piece which is initiated at a temperature of approximately 277° C. (550 K) which is approximately 200° C. lower than the crystallization temperature. Such an elongation suggests the softening phenomenon of the alloy near the crystallization temperature region.

FIG. 3A also shows a TMA curve of a crystalline alloy having a composition $(Fe_2Dy_{0.7}Tb_{0.3})_{95}Nb_2B_3$ for comparison. The crystalline alloy does not show the softening phenomenon.

Example 3

A quenched ribbon having a given composition was prepared as in EXAMPLE 1. The quenched ribbon was pulverized using a rotor mill to prepare a powder. Grains of 53 to 105 μm were selected by screening. Approximately 2 grams of selected powder was packed into a tungsten carbide die 1 using a handpress and the die 1 filled with the powder was loaded into an outer die 8, as shown in FIG. 1. The chamber was pressured by the upper and lower punches in an atmosphere of $3\times10^{-5}$ torr, and a series of pulse waves were simultaneously applied to the powder through a pulse supply unit. As shown in FIG. 2, a unit pulse sequence of the pulse waves includes 12 pulses and a pause corresponding to two pulses. The maximum pulse current was 4,700 to 4,800 A.

Figure 4:
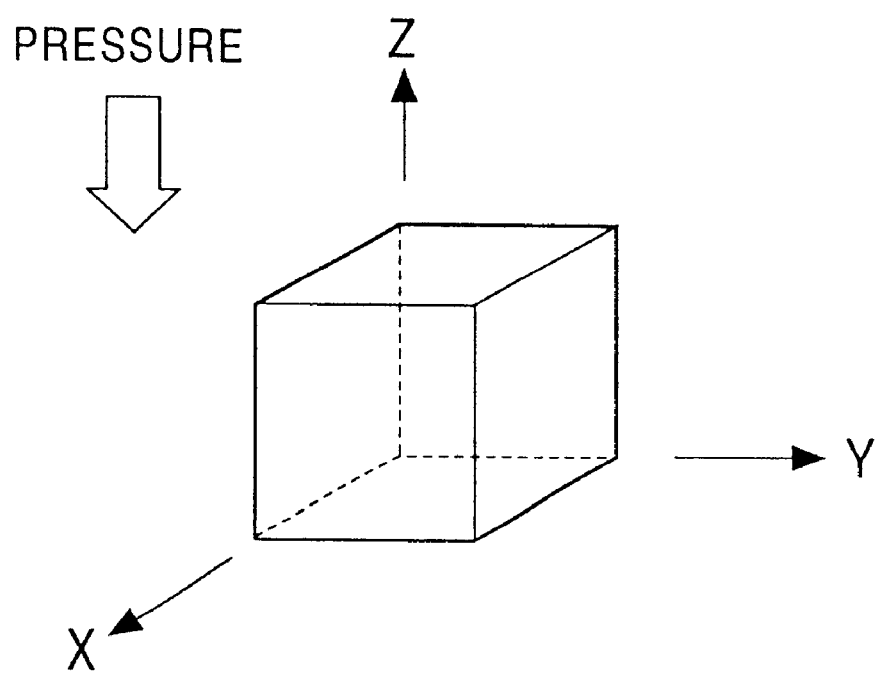
FIG. 4 is an isometric view illustrating the direction of the sintering pressure which is applied to a magnetostrictive material during the production of a compact in accordance with the present invention.

The powder was heated from room temperature to an annealing temperature (sintering temperature) shown in Table 2 at a heating rate of 100° C./min., while a pressure of approximately $6.5\times10^3$ kg/cm$^2$ was applied to the powder and maintained at that temperature for approximately 8 minutes. Sintering and annealing of the alloy powder were simultaneously performed. As a result, a compact in which a pressure was applied in the Z direction as shown in FIG. 4 was obtained.

A series of compacts having compositions of $(Fe_2Dy_{0.7}Tb_{0.3})_{94}Nb_6$, $(Fe_2Dy_{0.7}Tb_{0.3})_{94}Zr_6$, $(Fe_2Dy_{0.7}Tb_{0.3})_{96}Si_4$, $(Fe_2Dy_{0.7}Tb_{0.3})_{93}Nb_2B_5$, $(Fe_2Dy_{0.7}Tb_{0.3})_{93}Nb_2Si_5$, $(Fe_2Dy_{0.7}Tb_{0.3})_{92}Nb_8$, and $(Fe_2Dy_{0.7}Tb_{0.3})_{91}Si_3B_6$ were prepared in this manner.

The magnetostriction constants in the Z and X directions of each compact were measured for an applied magnetic field of 5 kOe at room temperature. The results, as well as the relative density of each compact, are shown in Table 2.

Table 2 also includes the magnetostriction constants and the relative density of a sample having a composition $(Fe_2Dy_{0.7}Tb_{0.3})_{93}Nb_2Si_5$ which was sintered at an annealing (sintering) temperature in the spark plasma sintering apparatus. Further, Table 2 includes the magnetostriction constants and the relative density of a sample having a composition $(Fe_2Dy_{0.7}Tb_{0.3})_{98}Nb_2$ which was prepared by sintering of a crystalline powder having a crystalline phase by preannealing.

TABLE 2

| Composition of alloy | Annealing temperature (° C.) | Magnetostriction constant ($\times 10^{-6}$) Z axis | Magnetostriction constant ($\times 10^{-6}$) X axis | Relative density (%) |
|---|---|---|---|---|
| $(Fe_2Dy_{0.7}Tb_{0.3})_{94}Nb_6$ | 550 | 850 | 760 | 95 |
| $(Fe_2Dy_{0.7}Tb_{0.3})_{94}Zr_6$ | 550 | 700 | 600 | 98 |
| $(Fe_2Dy_{0.7}Tb_{0.3})_{93}Nb_2B_5$ | 600 | 1,000 | 800 | 99 |
| $(Fe_2Dy_{0.7}Tb_{0.3})_{93}Nb_2Si_5$ | 600 | 950 | 700 | 97 |
| $(Fe_2Dy_{0.7}Tb_{0.3})_{92}Nb_8$ | 600 | 810 | 600 | 96 |
| $(Fe_2Dy_{0.7}Tb_{0.3})_{91}Si_3B_6$ | 600 | 550 | 500 | 98 |
| $(Fe_2Dy_{0.7}Tb_{0.3})_{93}Nb_2Si_5$ | 400 | 400 | 390 | 85 |
| $(Fe_2Dy_{0.7}Tb_{0.3})_{98}Nb_2$ | 600 | 500 | 480 | 82 |

As shown in Table 2, the compacts annealed at 550° C. to 600° C. have high relative densities of higher than 90%. The magnetostriction constant in the Z-axis is high for each sample. The magnetostrictive constant in the Y-axis is lower than that in the Z-axis for each sample. These results suggest that the easy axes of the crystal grains are oriented in the Z-axis, resulting in an increase in magnetic susceptibility during the sintering process under a pressure applied to the Z-axis direction, and thus the electromechanical coupling coefficient is increased.

The $(Fe_2Dy_{0.7}Tb_{0.3})_{93}Nb_2Si_5$ compact sintered at 400° C. has a low relative density of 85% and a low magnetostriction constant. The low relative density probably results in low soft magnetism and thus a low electromechanical coupling coefficient of the compact.

The $(Fe_2Dy_{0.7}Tb_{0.3})_{98}Nb_2$ compact prepared from the crystalline alloy powder which was preannealed has a low relative density of 82% and a low magnetostriction constant. The crystalline powder does not show a softening phenomenon during the sintering process, hence grains probably do not closely adhere to each other. As a result, the relative density does not increase and the electromechanical coupling coefficient is decreased.

Example 4

Quenched ribbons having compositions $(Fe_2Dy_{0.7}Tb_{0.3})_{96}Si_4$, $(Fe_2Dy_{0.7}Tb_{0.3})_{93}Nb_2B_5$, and $(Fe_2Dy_{0.7}Tb_{0.3})_{93}Nb_2Si_5$ were prepared as in EXAMPLE 4. Each of the quenched ribbons was heated to a temperature of 500° C. to 800° C. and held at the temperature for approximately 3 minutes in an infrared furnace of $1\times10-2$ Pa or less. Immediately after the quenching, the $(Fe_2Dy_{0.7}Tb_{0.3})_{96}Si_4$ ribbon was annealed at 500° C., 600° C., 650° C., and 700° C. and subjected to X-ray diffractometry. The results are shown in FIGS. 5 to 9. The average crystal grain sizes of the $(Fe_2Dy_{0.7}Tb_{0.3})_{93}Nb_2B_5$ and $(Fe_2Dy_{0.7}Tb_{0.3})_{93}Nb_2Si_5$ ribbons were determined by transmittance electron microscopy. The results are shown in Table 3.

Figure 5:
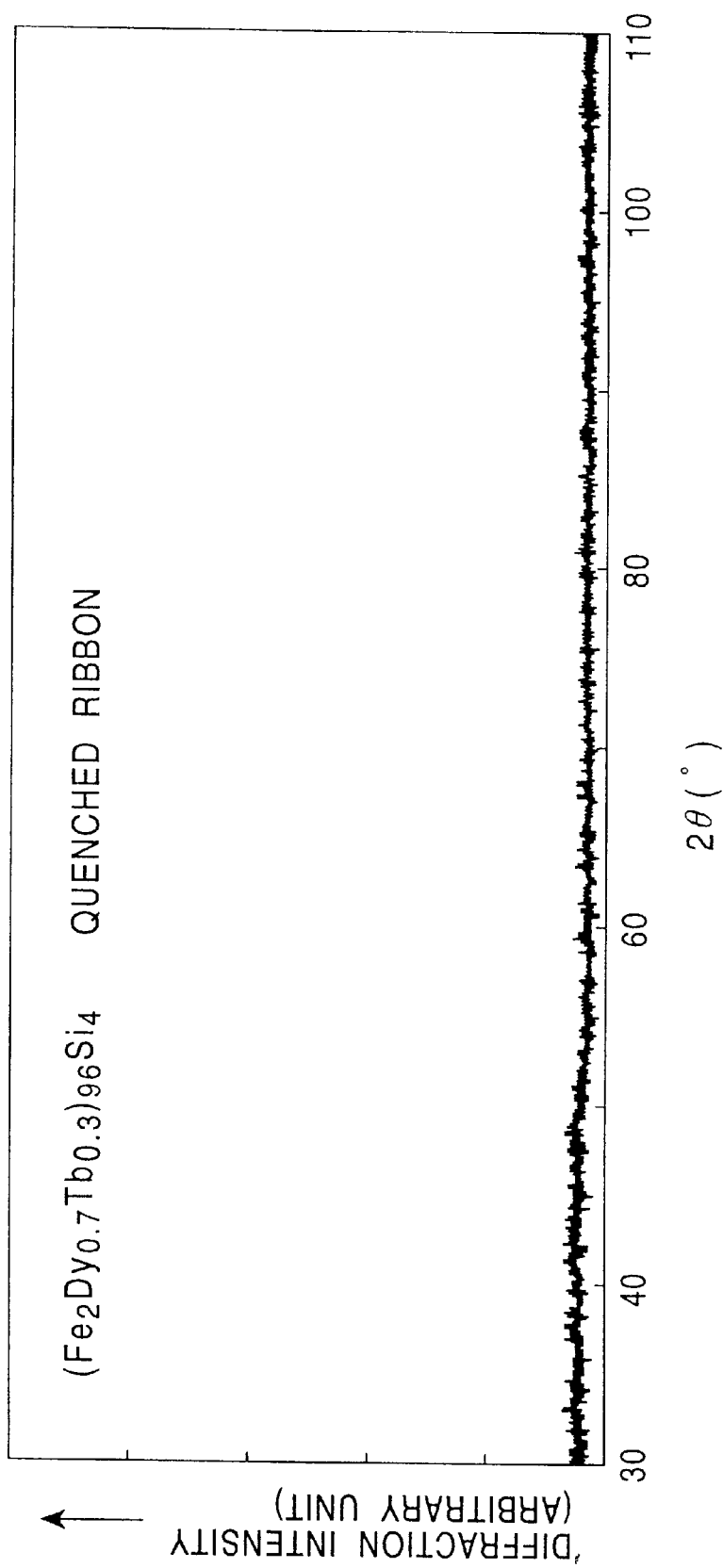
FIG. 5 is an X-ray diffraction pattern of a quenched ribbon having a composition $(Fe_2Dy_{0.7}Tb_{0.3})_{96}Si_4$.
Figure 6:
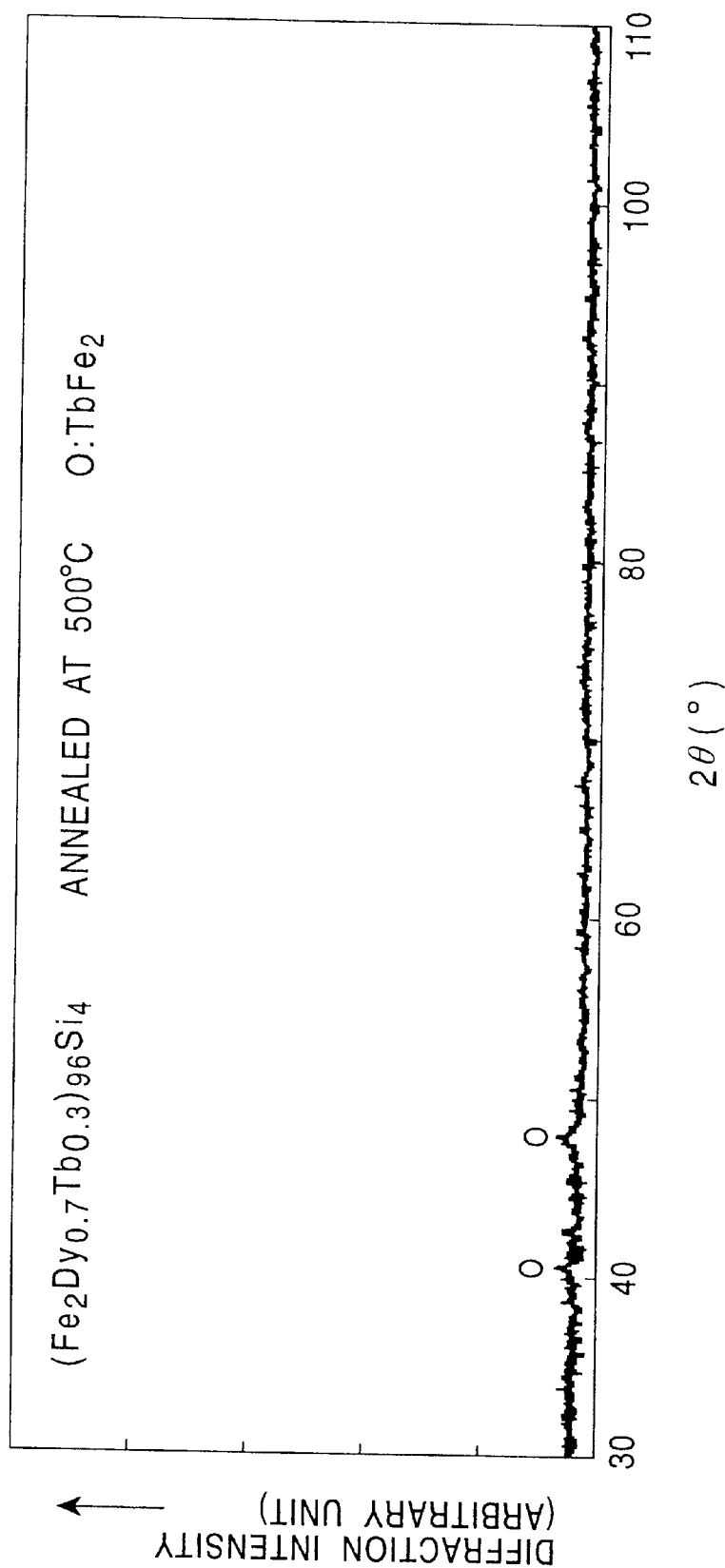
FIG. 6 is an X-ray diffraction pattern of a quenched ribbon having a composition $(Fe_2Dy_{0.7}Tb_{0.3})_{96}Si_4$ and annealed at 500° C.
Figure 7:
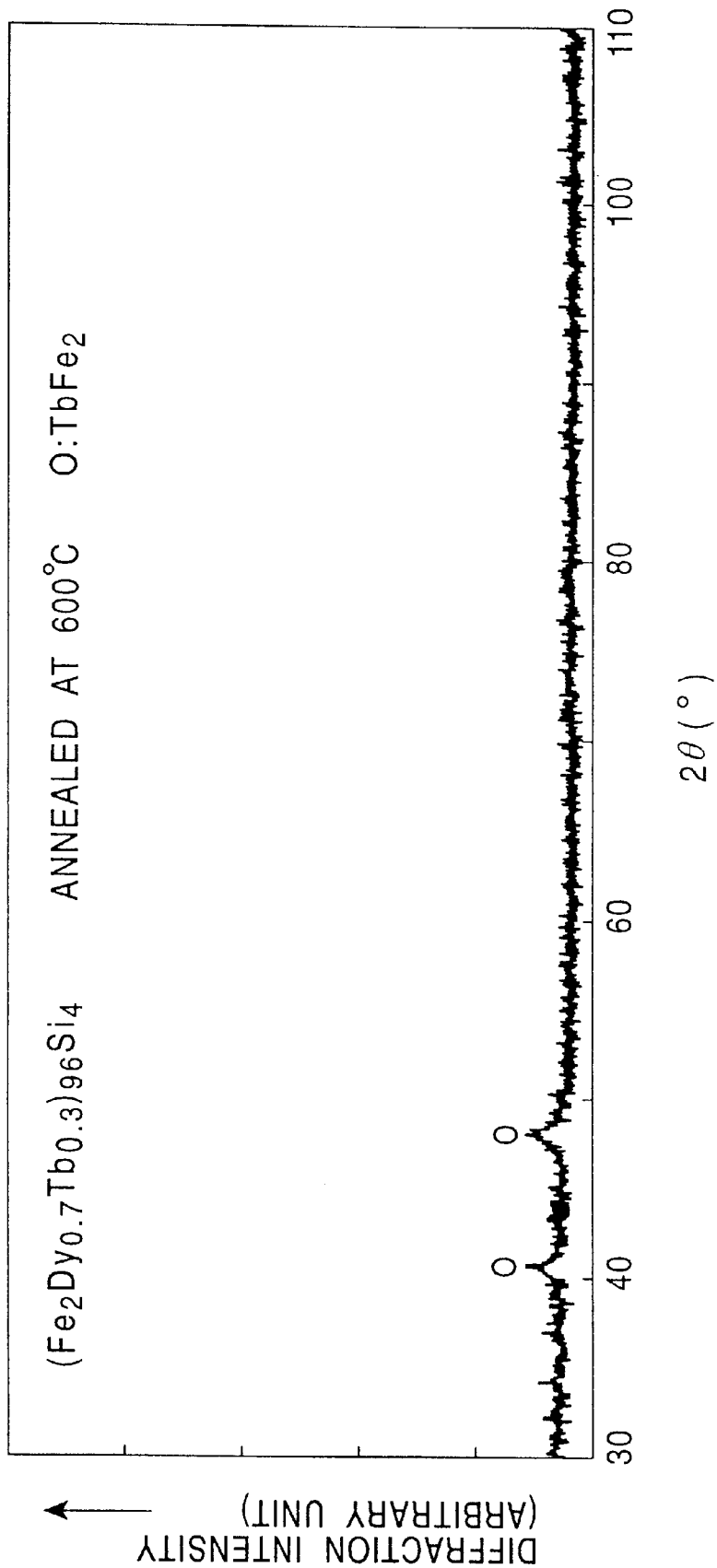
FIG. 7 is an X-ray diffraction pattern of a quenched ribbon having a composition $(Fe_2Dy_{0.7}Tb_{0.3})_{96}Si_4$ and annealed at 600° C.
Figure 8:
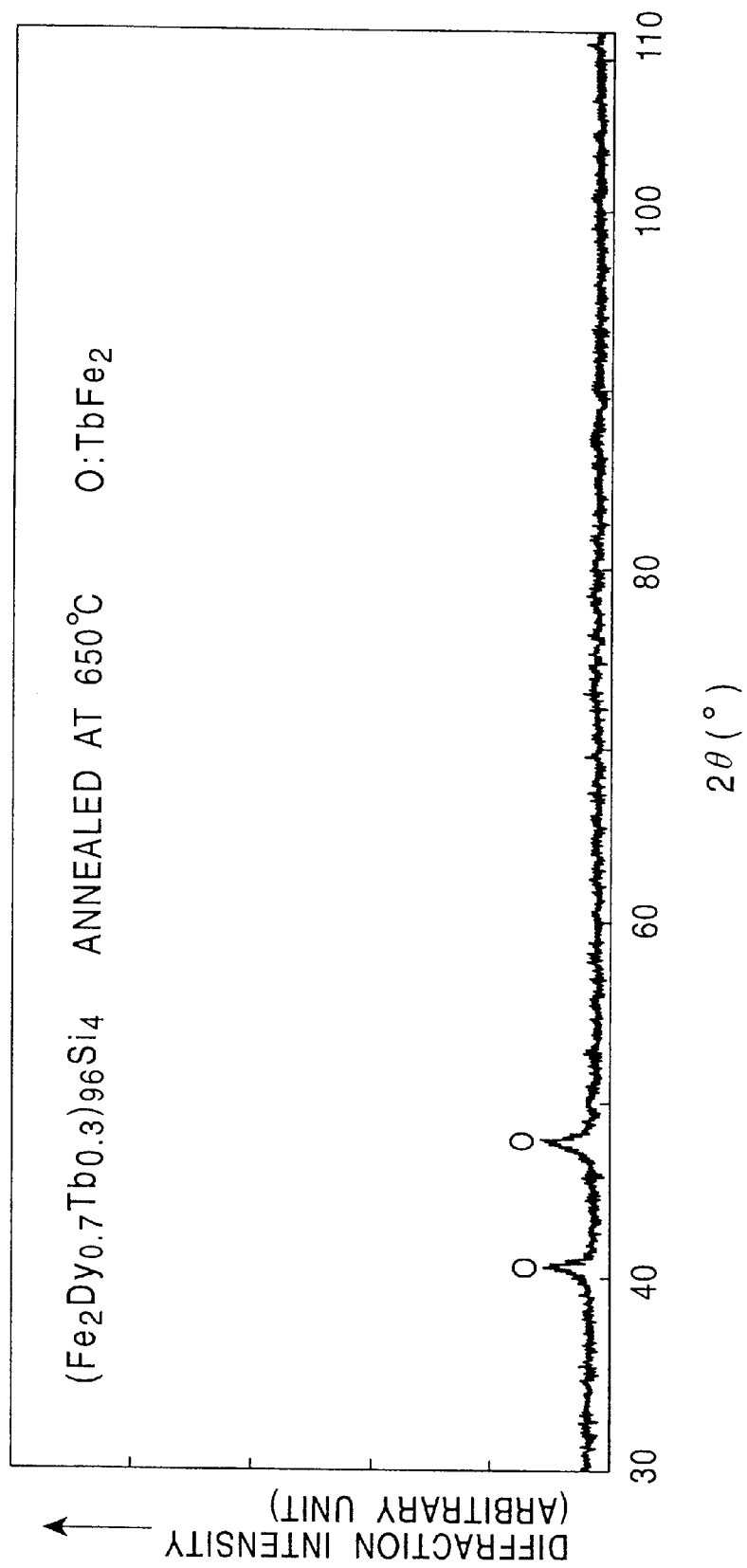
FIG. 8 is an X-ray diffraction pattern of a quenched ribbon having a composition $(Fe_2Dy_{0.7}Tb_{0.3})_{96}Si_4$ and annealed at 650° C.
Figure 9:
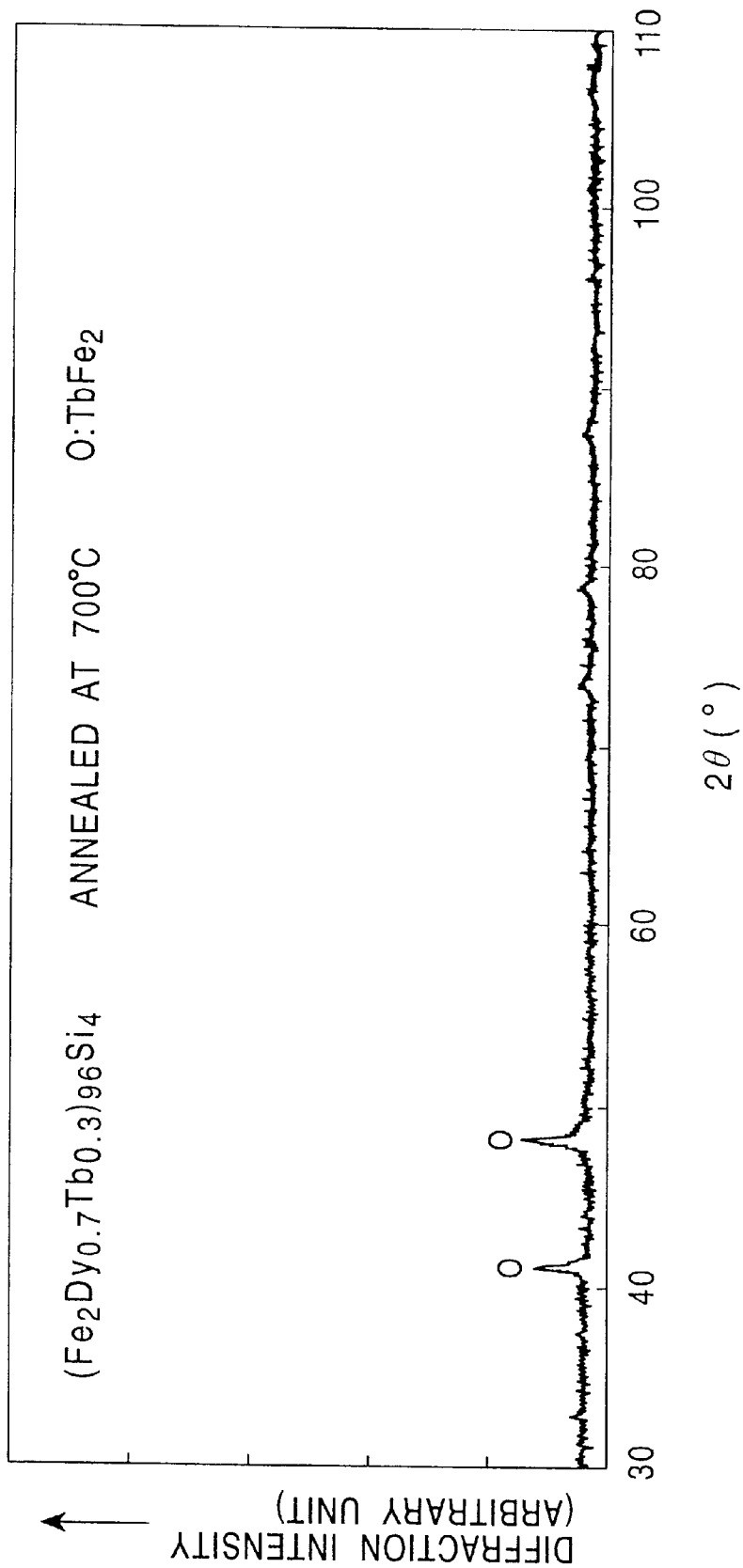
FIG. 9 is an X-ray diffraction pattern of a quenched ribbon having a composition $(Fe_2Dy_{0.7}Tb_{0.3})_{96}Si_4$ and annealed at 700° C.

A halo pattern shown in FIG. 5 suggests that the quenched ribbon which was not annealed is an alloy primarily composed of an amorphous phase. In contrast, as shown in FIGS. 6 to 9, diffraction patterns assigned to the TbFe$_2$ crystal phase are observed for the annealing temperature of 500° C. or more. Table 3 shows that fine crystalline phases having an average grain size of 30 nm are deposited in the alloy which is annealed at a temperature of 500° C. or more.

TABLE 3

| Composition of alloy | Annealing temperature (° C.) | Average crystal grain size (nm) |
|---|---|---|
| $(Fe_2Dy_{0.7}Tb_{0.3})_{93}Nb_2B_5$ | 500 | 30 |
| $(Fe_2Dy_{0.7}Tb_{0.3})_{93}Nb_2B_5$ | 600 | 30 |
| $(Fe_2Dy_{0.7}Tb_{0.3})_{93}Nb_2B_5$ | 700 | 30 |
| $(Fe_2Dy_{0.7}Tb_{0.3})_{93}Nb_2B_5$ | 800 | 100 |
| $(Fe_2Dy_{0.7}Tb_{0.3})_{93}Nb_2Si_5$ | 500 | 25 |
| $(Fe_2Dy_{0.7}Tb_{0.3})_{93}Nb_2Si_5$ | 600 | 30 |
| $(Fe_2Dy_{0.7}Tb_{0.3})_{93}Nb_2Si_5$ | 700 | 30 |
| $(Fe_2Dy_{0.7}Tb_{0.3})_{93}Nb_2Si_5$ | 800 | 80 |

Example 5

Quenched ribbons having the following compositions were prepared as in EXAMPLE 1: $(Fe_2Dy_{0.7}Tb_{0.3})_{98}Si_2$, $(Fe_2Dy_{0.7}Tb_{0.3})_{96}Si_4$, $(Fe_2Dy_{0.7}Tb_{0.3})_{94}Si_6$, $(Fe_2Dy_{0.7}Tb_{0.3})_{92}Si_8$, $(Fe_2Dy_{0.7}Tb_{0.3})_{96}B_4$, $(Fe_2Dy_{0.7}Tb_{0.3})_{94}B_6$, and $(Fe_2Dy_{0.7}Tb_{0.3})_{92}B_8$.

Figure 10A:
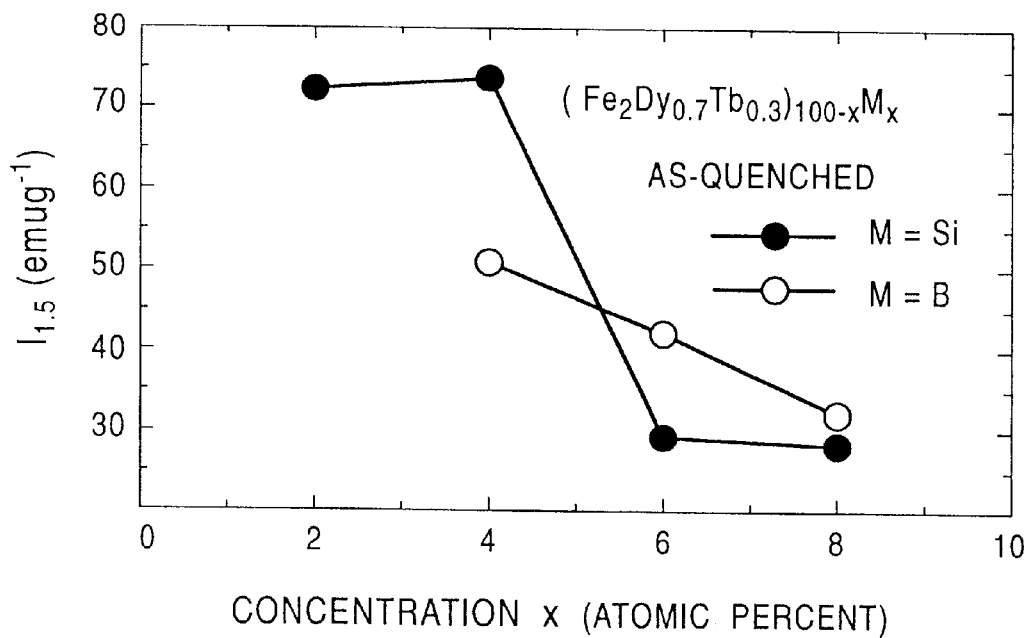
FIG. 10 is a graph illustrating magnetic characteristics of a quenched ribbon having a composition $(Fe_2Dy_{0.7}Tb_{0.3})_{100-x}(Si,B)_x$ (Si: x=2, 4, 6, or 8; B: x=4, 6 or 8)
Figure 10B:
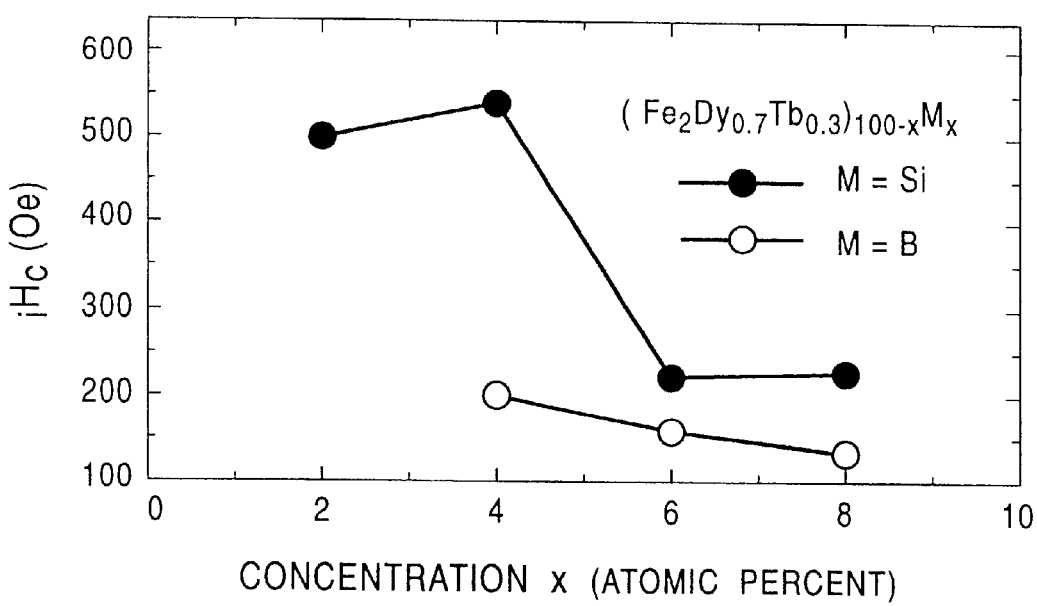
Figure 11A:
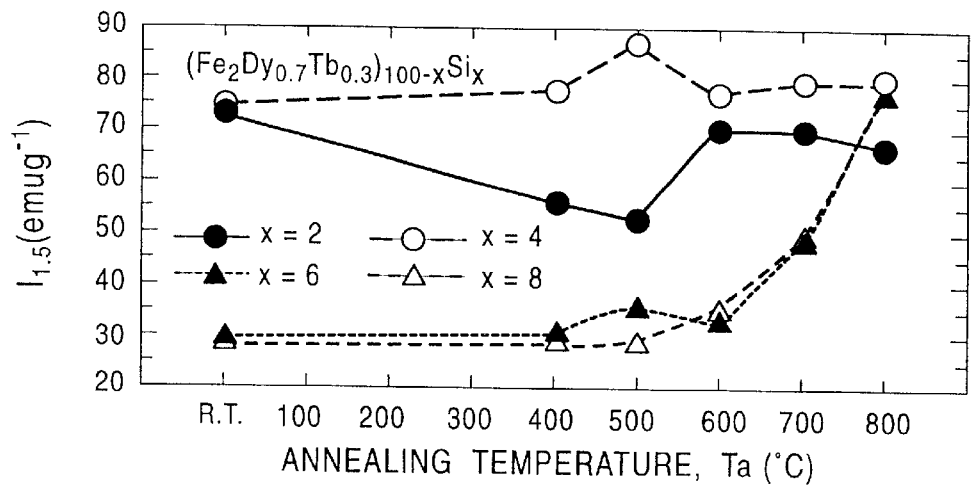
FIG. 11 is a graph illustrating magnetic characteristics of a quenched ribbon having a composition $(Fe_2Dy_{0.7}Tb_{0.3})_{100-x}Si_x$ (x=2, 4, 6, or 8)
Figure 11B:
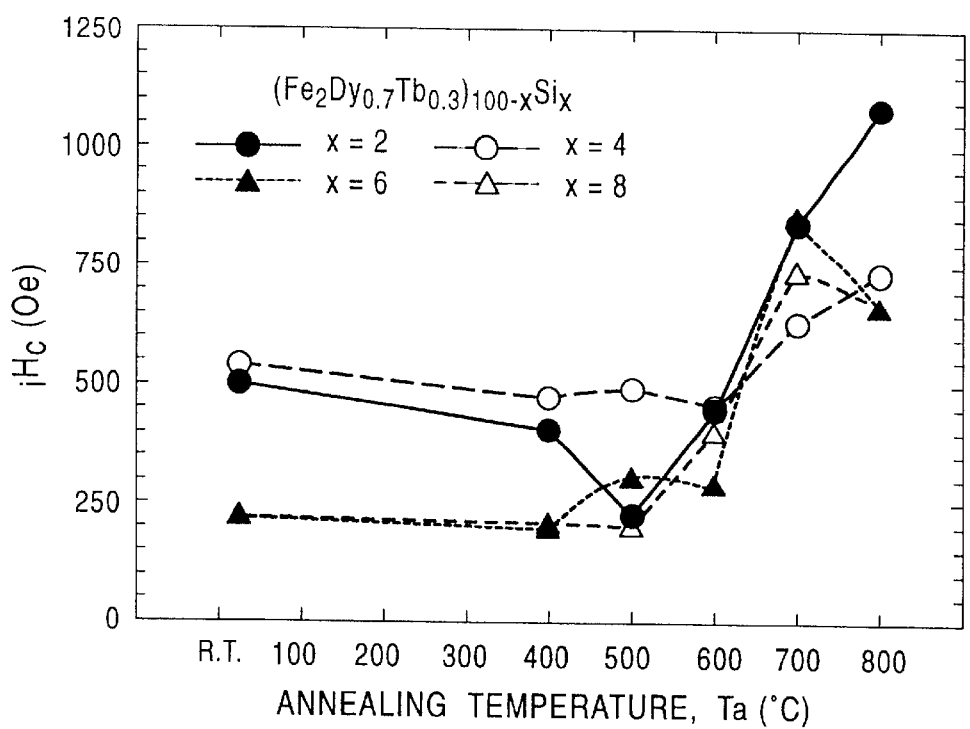
Figure 12A:
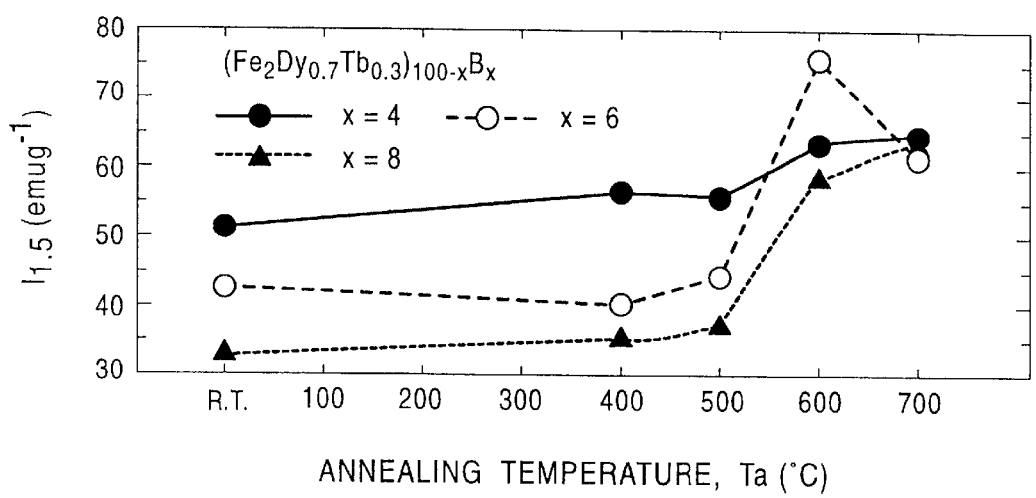
FIG. 12 is a graph illustrating magnetic characteristics of a quenched ribbon having a composition $(Fe_2Dy_{0.7}Tb_{0.3})_{100-x}B_x$ (x=4, 6, or 8)
Figure 12B:
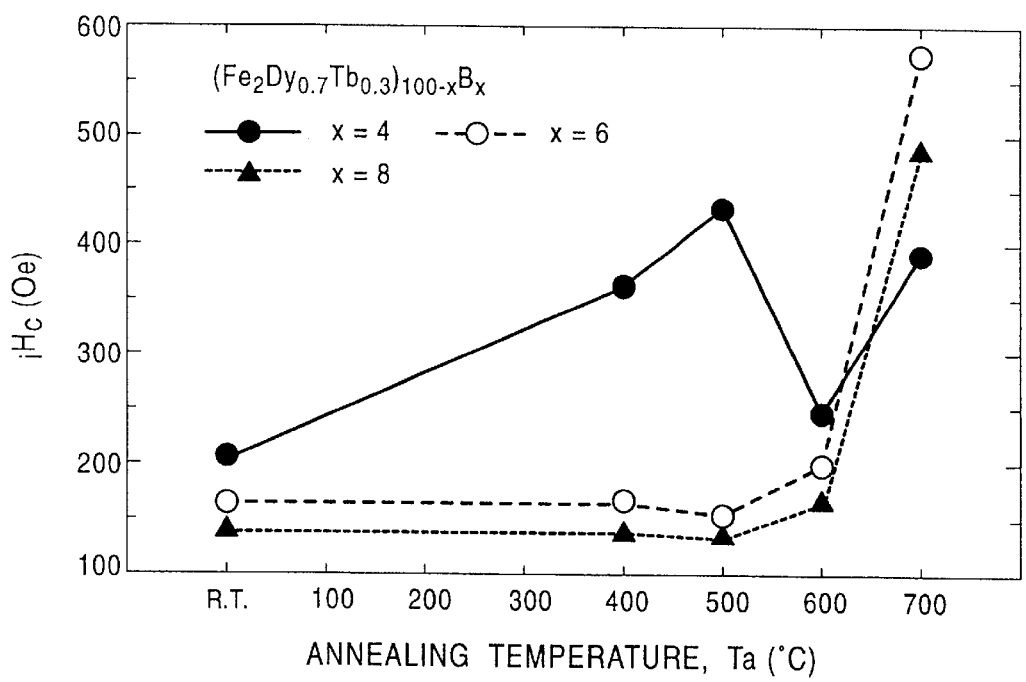

FIGS. 10A and 10B show the magnetization ($I_{1.5}$) and the coercive force (iHc), respectively, of the quenched ribbons at an applied magnetic field of 1.5 T. As shown in FIGS. 10A and 10B, in the quenched ribbons of $(Fe_2Dy_{0.7}Tb_{0.3})_{100-x}(Si,B)_x$ (Si: x=2, 4, 6, or 8; B: x=4, 6, or 8), the magnetization ($I_{1.5}$) and the coercive force (iHc) tend to decrease with an increased x. Particularly, by controlling the content of the element M to 4 atomic percent $<x\leq 8$ atomic percent, the soft magnetism of the quenched ribbon will be improved so that the quenched ribbon is easily magnetized by an external magnetic field, resulting in an increase in the electromechanical coupling coefficient and the magnetostriction constant.

Each quenched ribbon was heated to a temperature in a range of 400° C. to 700° C. (for the B-containing alloy) or 800° C. (for the Si-containing alloy) and maintained at that temperature for approximately 3 minutes in an infrared furnace at $1\times10^{-2}$ Pa or less to form a fine crystalline texture.

FIGS. 11A, 11B, 12A and 12B are graphs of the magnetization ($I_{1.5}$) at an applied magnetic field of 1.5 T and the coercive force (iHc) at various annealing temperatures of the fine crystalline ribbon. FIGS. 11A to 12B show that magnetization tends to increase as the annealing temperature increases. The coercive force (iHc) rapidly increases while the soft magnetism tends to decrease at an annealing temperature of higher than 600° C. Thus, the optimum annealing temperature for achieving a high magnetization ($I_{1.5}$) and a high coercive force (iHc) is 600° C. in both cases containing Si or B as the element M.

Figure 13:
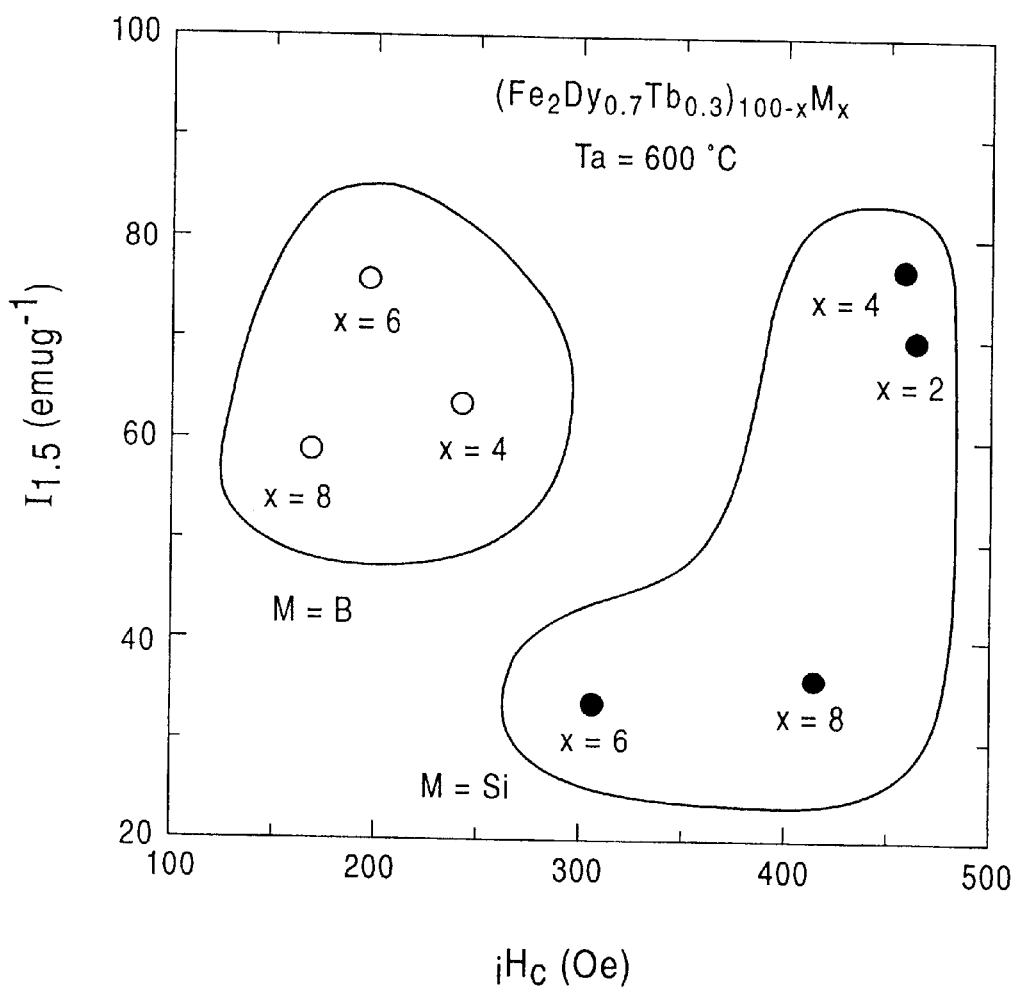
FIG. 13 is a graph illustrating magnetic characteristics of a quenched ribbon having a composition $(Fe_2Dy_{0.7}Tb_{0.3})_{96}Si_4$ and annealed at 600°C.

FIG. 13 is a graph of a distribution of the magnetization ($I_{1.5}$) and the coercive force (iHc) of the ribbons which were annealed at the optimum temperature of 600° C. FIG. 13 shows that the B-containing fine-crystalline ribbons have higher coercive forces (iHc) and slightly higher magnetization (I1.5) compared with the Si-containing ribbons. Thus, the B-containing ribbons have superior soft magnetism.

Example 6

Figure 14:
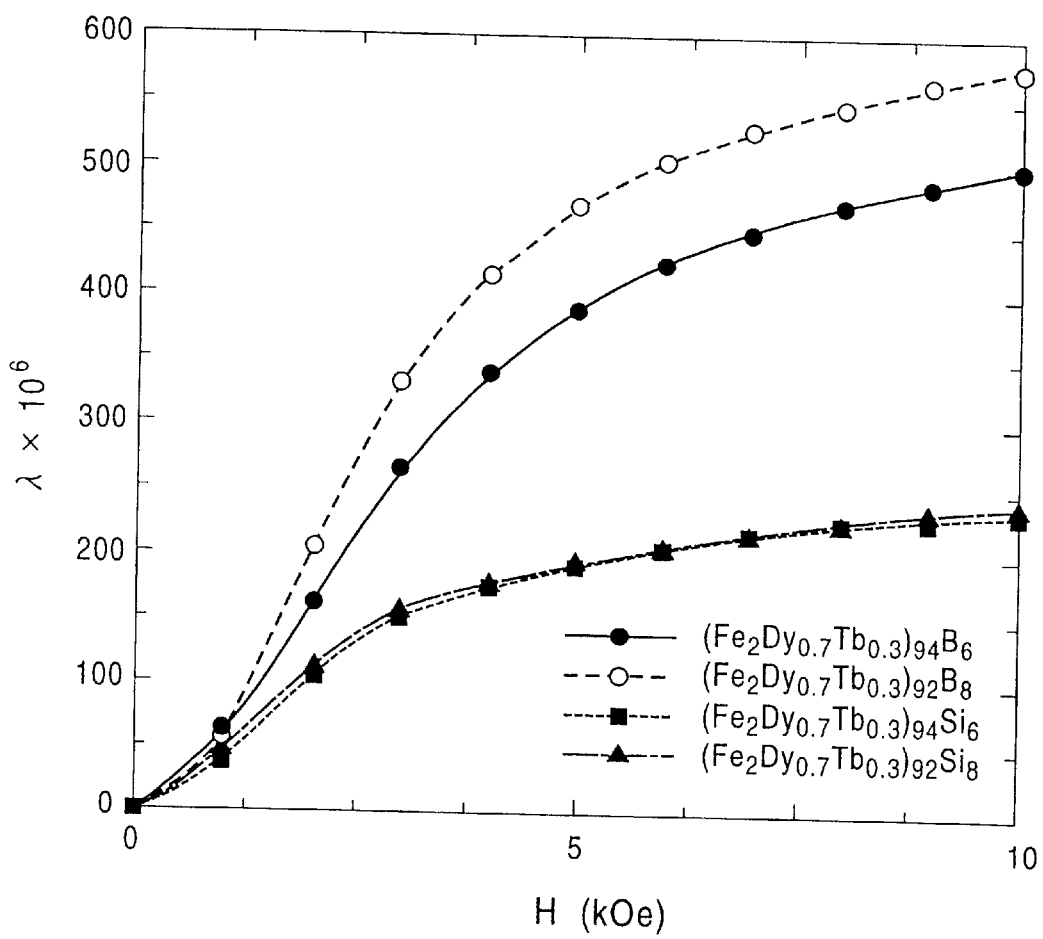
FIG. 14 is a graph of applied magnetic field versus magnetostriction of a compact having a composition $(Fe_2Dy_{0.7}Tb_{0.3})_{100-x}(Si,B)_x$ (x=6 or 8)

Compacts were prepared from the $(Fe_2Dy_{0.7}Tb_{0.3})_{94}Si_6$, $(Fe_2Dy_{0.7}Tb_{0.3})_{92}Si_8$, $(Fe_2Dy_{0.7}Tb_{0.3})_{94}B_6$, and $(Fe_2Dy_{0.7}Tb_{0.3})_{92}B_8$ quenched ribbons at a compaction temperature of 600° C. as in EXAMPLE 3. FIG. 14 is a graph of magnetostriction λ of the compacts for an applied magnetic field of 0 to 10 kOe at room temperature. FIG. 14 shows that the B-containing compacts have higher magnetostriction values compared to the Si-containing compacts. Thus, the B-containing compacts have superior soft magnetism because of a lower coercive force, and have superior magnetostrictive characteristics because of a higher magnetostriction value at a low magnetic field.

Figure 15:
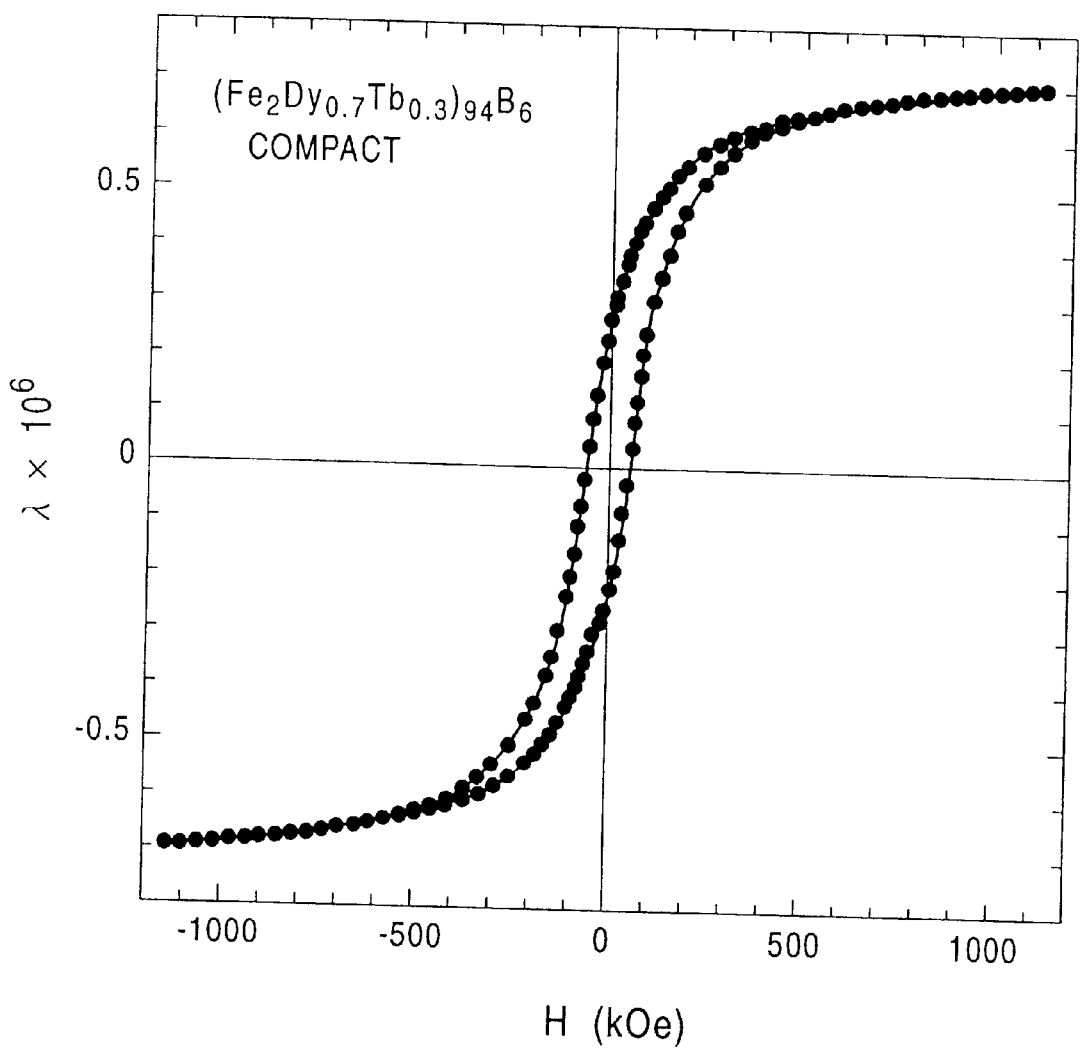
FIG. 15 is a graph of a magnetization curve (BH curve) of a compact having a composition $(Fe_2Dy_{0.7}Tb_{0.3})_{94}B_6$.
Figure 16:
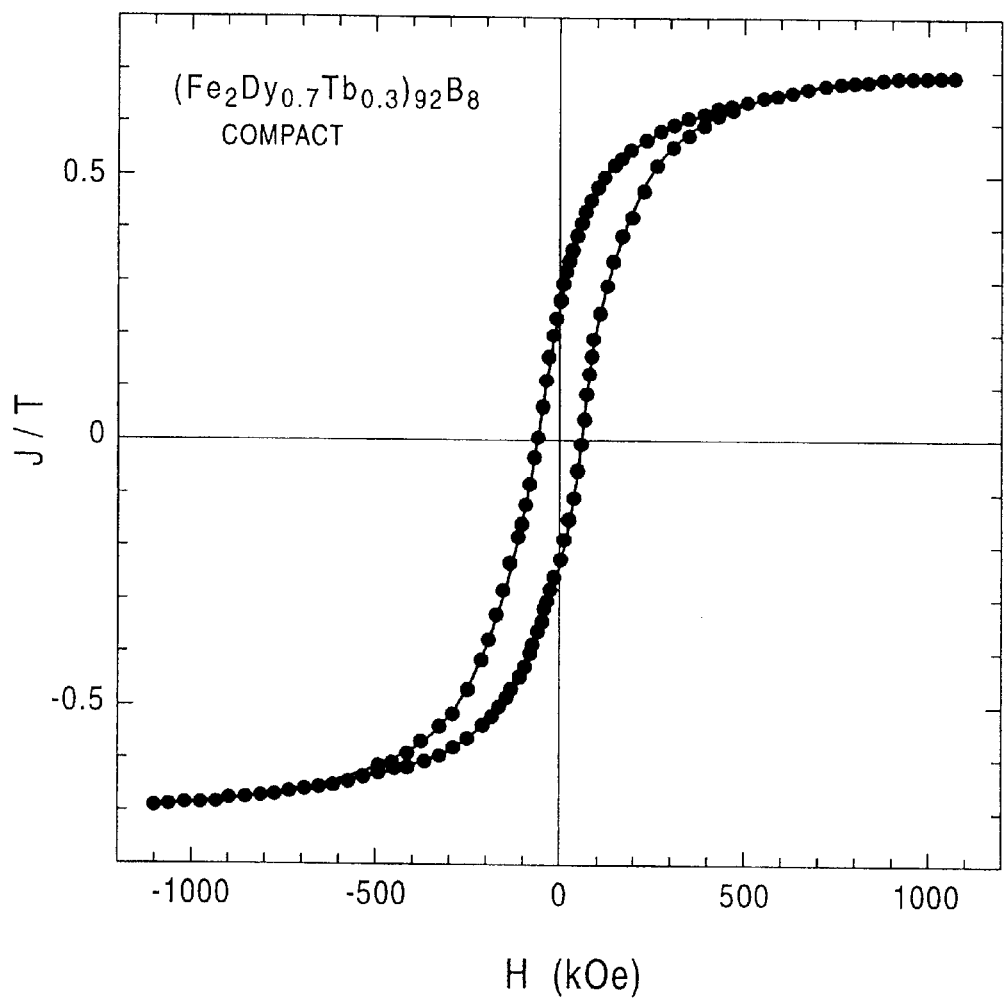
FIG. 16 is a graph of a magnetization curve (BH curve) of a compact having a composition $(Fe_2Dy_{0.7}Tb_{0.3})_{92}B_8$.

FIGS. 15 and 16 are graphs of magnetization curves (BH curves) of the $(Fe_2Dy_{0.7}Tb_{0.3})_{94}B_6$ and $(Fe_2Dy_{0.7}Tb_{0.3})_{92}B_8$ compacts which have a high density of 8.7 g·cm$^{-3}$ and are physically stiff. The graphs shows that these B-containing compacts have excellent soft magnetism.

What is claimed is:

1. A magnetostrictive material produced by annealing an alloy consisting essentially of an amorphous phase and comprising Fe, Dy, and Tb as primary components, at least one element selected from the group consisting of Ta, Nb, Zr, Hf, V, W, Mo, Si and B and/or at least one element selected from the group consisting of Cr, Al, Ga, Ge, Cu, Au, Ag, Pt, Pd, Os, Ir, and Rh; wherein said magnetostrictive material is a compact formed by compacting and sintering a powder of said alloy consisting essentially of the amorphous phase so as to precipitate fine crystalline phases having an average crystal grain size of 100 nm or less;

said compact is formed by a softening phenomenon during crystallization of said alloy; and said alloy comprises a crystalline phase after said annealing.

2. A magnetostrictive material according to claim 1, wherein said compact is formed by simultaneously compacting and crystallizing said powder of said alloy under a pressure.

3. A magnetostrictive material according to claim 2, wherein said magnetostrictive material has magnetic anisotropy in the direction of the pressure which is applied to said magnetostrictive material.

4. A magnetostrictive material according to claim 1, wherein said compact has a relative density of 90% or more.

5. A magnetostrictive material according to claim 2 wherein said compact has a relative density of 90% or more.

6. A magnetostrictive material according to claim 1, wherein said compact is formed by sintering and simultaneously annealing the powder of said alloy consisting essentially of the amorphous phase so as to precipitate said fine crystalline phases having an average crystal grain size of 100 nm or less during said compacting.

7. A magnetostrictive material according to claim 2, wherein said compact is formed by sintering and simultaneously annealing the powder of said alloy consisting essentially of the amorphous phase so as to precipitate said fine crystalline phases having an average crystal grain size of 100 nm or less during said compacting.

8. A magnetostrictive material according to claim 6, wherein the temperature of the annealing is in a range of 400° C. to 800° C.

9. A magnetostrictive material according to claim 7, wherein the temperature of the annealing is in a range of 400° C. to 800° C.

10. A magnetostrictive material according to claim 1, wherein said alloy is represented by the formula:

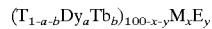

wherein T denotes at least one element selected from the group consisting of Fe, Co and Ni; M denotes at least one element selected from the group consisting of Ta, Nb, Zr, Hf, V, W, Mo, Si and B; E denotes at least one element selected from the group consisting of Cr, Al, Ga, Ge, Cu, Au, Ag, Pt, Pd, Os, Ir, and Rh; $0 \leq a \leq 0.5$; $0 \leq b \leq 0.5$; $0.1 \leq a+b \leq 0.5$; 0 atomic percent $\leq x \leq 10$ atomic percent; 0 atomic percent $\leq y \leq 10$ atomic percent; and 2 atomic percent $\leq x+y \leq 20$ atomic percent.

11. A magnetostrictive material according to claim 2, wherein said alloy is represented by the formula:

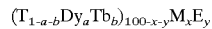

wherein T denotes at least one element selected from the group consisting of Fe, Co and Ni; M denotes at least one element selected from the group consisting of Ta, Nb, Zr, Hf, V, W, Mo, Si and B; E denotes at least one element selected from the group consisting of Cr, Al, Ga, Ge, Cu, Au, Ag, Pt, Pd, Os, Ir, and Rh; $0 \leq a \leq 0.5$; $0 \leq b \leq 0.5$; $0.1 \leq a+b \leq 0.5$; 0 atomic percent $\leq x \leq 10$ atomic percent; 0 atomic percent $\leq y \leq 10$ atomic percent; and 2 atomic percent $\leq x+y \leq 20$ atomic percent.

12. A magnetostrictive material according to claim 6, wherein said alloy is represented by the formula:

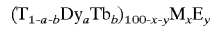

wherein T denotes at least one element selected from the group consisting of Fe, Co and Ni; M denotes at least one element selected from the group consisting of Ta, Nb, Zr, Hf, V, W, Mo, Si and B; E denotes at least one element selected from the group consisting of Cr, Al, Ga, Ge, Cu, Au, Ag, Pt, Pd, Os, Ir, and Rh; $0 \leq a \leq 0.5$; $0 \leq b \leq 0.5$; $0.1 \leq a+b \leq 0.5$; 0 atomic percent $\leq x \leq 10$ atomic percent; 0 atomic percent $\leq y \leq 10$ atomic percent; and 2 atomic percent $\leq x+y \leq 20$ atomic percent.

13. A magnetostrictive material according to claim 7, wherein said alloy is represented by the formula:

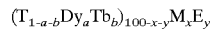

wherein T denotes at least one element selected from the group consisting of Fe, Co and Ni; M denotes at least one element selected from the group consisting of Ta, Nb, Zr, Hf, V, W, Mo, Si and B; E denotes at least one element selected from the group consisting of Cr, Al, Ga, Ge, Cu, Au, Ag, Pt, Pd, Os, Ir, and Rh; $0 \leq a \leq 0.5$; $0 \leq b \leq 0.5$; $0.1 \leq a+b \leq 0.5$; 0 atomic percent $\leq x \leq 10$ atomic percent; 0 atomic percent $\leq y \leq 10$ atomic percent; and 2 atomic percent $\leq x+y \leq 20$ atomic percent.

14. A magnetostrictive material produced by annealing an alloy consisting essentially of an amorphous phase and comprising Fe, Dy, and Tb as primary components, at least one element selected from the group consisting of Ta, Nb, Zr, Hf, V, W, Mo, Si and B and/or at least one element selected from the group consisting of Cr, Al, Ga, Ge, Cu, Au, Ag, Pt, Pd, Os, Ir, and Rh; wherein said magnetostrictive material is a compact formed by compacting and sintering a powder of said alloy consisting essentially of the amorphous phase so as to precipitate fine crystalline phases having an average crystal grain size of 100 nm or less; and said alloy comprises a crystalline phase after said annealing.

* * * * *